(12) United States Patent
Hayashi

(10) Patent No.: US 12,021,039 B2
(45) Date of Patent: Jun. 25, 2024

(54) WIRING SUBSTRATE

(71) Applicant: NGK SPARK PLUG CO., LTD., Nagoya (JP)

(72) Inventor: Takahiro Hayashi, Nagoya (JP)

(73) Assignee: NITERRA CO., LTD., Nagoya (JP)

( * ) Notice: Subject to any disclaimer, the term of this patent is extended or adjusted under 35 U.S.C. 154(b) by 0 days.

(21) Appl. No.: 18/183,250

(22) Filed: Mar. 14, 2023

(65) Prior Publication Data
US 2023/0299011 A1   Sep. 21, 2023

(30) Foreign Application Priority Data

Mar. 18, 2022   (JP) ................... 2022-043585

(51) Int. Cl.
*H01L 23/544* (2006.01)
*B32B 3/30* (2006.01)
*B32B 15/20* (2006.01)

(52) U.S. Cl.
CPC .............. *H01L 23/544* (2013.01); *B32B 3/30* (2013.01); *B32B 15/20* (2013.01); *B32B 2457/08* (2013.01)

(58) Field of Classification Search
None
See application file for complete search history.

(56) References Cited

U.S. PATENT DOCUMENTS 10,147,666 B1 * 12/2018 Trimberger ........... H01L 23/544

FOREIGN PATENT DOCUMENTS

| JP | 2009-065471 A | 3/2009 |
| JP | 2015-103988 A | 6/2015 |
| JP | 2015-231001 A | 12/2015 |

OTHER PUBLICATIONS

Intellectual Property Office (UK). Search Report issued in corresponding Application No. GB2303882.1, mailed Sep. 14, 2023.

* cited by examiner

*Primary Examiner* — Alexander S Thomas
(74) *Attorney, Agent, or Firm* — Stites & Harbison, PLLC; Jeffrey A. Haeberlin

(57) ABSTRACT

Disclosed is a wiring substrate whose orientation can be easily recognized and which can prevent occurrence of a failure which would otherwise occur after a semiconductor device is mounted on the wiring substrate, or after an electronic component composed of the wiring substrate and the semiconductor device mounted thereon is mounted on a base substrate or the like. The wiring substrate includes a base substrate, and a metallic member disposed on a first face of the base substrate. The metallic member has a shape which is plane symmetric with respect to a plane which extends through a center of the first face and is perpendicular to the first face. A recess is formed, as a partial dent, on one of outer surfaces of the metallic member.

2 Claims, 5 Drawing Sheets

WIRING SUBSTRATE

CROSS REFERENCE TO RELATED APPLICATIONS

The present application claims priority from Japanese patent application 2022-43585 filed on Mar. 18, 2022, the entirety of the content of which is hereby incorporated by reference into this application.

TECHNICAL FIELD

The present invention relates to a wiring substrate.

BACKGROUND

A wiring substrate with a semiconductor device mounted thereon has been known (see, for example, JP2015-231001A). In the wiring substrate disclosed in JP2015-231001A, a vibration element is disposed, as an electronic component, in a cavity-like recess formed in a base substrate, and a lid defines a closed space in which the vibration element is disposed.

SUMMARY

Technical Problem

In a process of mounting a semiconductor device on a wiring substrate, the orientation of the semiconductor device must be recognized. However, in some cases, because of design and other factors, a wiring substrate has a shape (for example, a bilateral symmetric shape) whose orientation cannot be recognized. In such a case, the process of mounting a semiconductor device requires a considerable amount of labor and time. In addition, there has been a possibility that the semiconductor device is mounted on the wiring substrate while being erroneously oriented in relation to the wiring substrate. The technique disclosed in JP2015-231001A does not take into consideration recognition of the orientation of the wiring substrate. In some cases, in order to enable recognition of the orientation of a wiring substrate, a mark is applied to a metallic member of the wiring substrate by using ink. However, from the viewpoint of exposure of an electronic component (a wiring substrate with a semiconductor device mounted thereon) to a high-temperature environment, use of ink which gasifies at high temperature is not preferred, because the gas originating from the ink may cause a failure of the electronic component.

The present invention has been accomplished so as to solve the above-described problem. An object of the present invention is to provide a wiring substrate whose orientation can be easily recognized and which can prevent occurrence of a failure which would otherwise occur after a semiconductor device is mounted on the wiring substrate, or after an electronic component composed of the wiring substrate and the semiconductor device mounted thereon is mounted on a base substrate or the like.

Solution to Problem

The present invention can be realized in the following mode.

(1) According to one mode of the present invention, a wiring substrate is provided. The wiring substrate comprises a base substrate, and a metallic member disposed on a first face of the base substrate. The metallic member has a shape which is plane symmetric with respect to a plane which extends through a center of the first face and is perpendicular to the first face. A recess is formed, as a partial dent, on one of outer surfaces of the metallic member.

In this configuration, since the recess (partial dent) is formed on one outer surface of the metallic member, despite the plane-symmetric shape of the metallic member, the orientation of the wiring substrate can be easily recognized by using the recess as a mark. In the present configuration, the recess functioning as a mark is formed by changing the profile of the outer surface of the metallic member, rather than applying ink to the outer surface of the metallic member. Therefore, even in the case where an electronic component (the wiring substrate with a semiconductor device mounted thereon) is exposed to a high-temperature environment, the recess does not change and can be correctly recognized as a mark, unlike the case where a mark is formed by using ink. Also, since, unlike ink, the recess does not gasify, it is possible to prevent occurrence of an electrical failure or deterioration of sealing performance, which would otherwise occur due to corrosion of wiring of the base substrate by gas. Namely, in the wiring substrate of the present invention, occurrence of a failure of the electronic component (the wiring substrate with a semiconductor device mounted thereon) can be prevented. Furthermore, since the recess is formed before the metallic member is disposed on the base substrate, a step of applying ink after completion of the wiring substrate becomes unnecessary, and it is possible to eliminate the risk of being scratched or dirtied when ink is applied.

(2) In the wiring substrate of the above-described mode may be configured as follows. The first face is rectangular. The plane is parallel to one side of the first face. The base substrate and the metallic member have shapes which are plane symmetric with respect to the plane. The recess is formed on one of two outer surfaces of the metallic member which are located on opposite sides of the plane.

In this configuration, each of the base substrate and the metallic member has a rectangular plane-symmetric shape. Namely, even in the case where both the base substrate and the metallic member have plane-symmetric shapes, thereby making it difficult to recognize their orientations, the recess functioning as a mark enables recognition of the orientation of the wiring substrate as a whole.

The present invention can be realized in various modes. For example, the present invention can be realized as a wiring substrate, a semiconductor device, an electronic component, or a system including the wiring substrate, the semiconductor device, and/or the electronic component.

DESCRIPTION OF EMBODIMENTS

Figure 1:
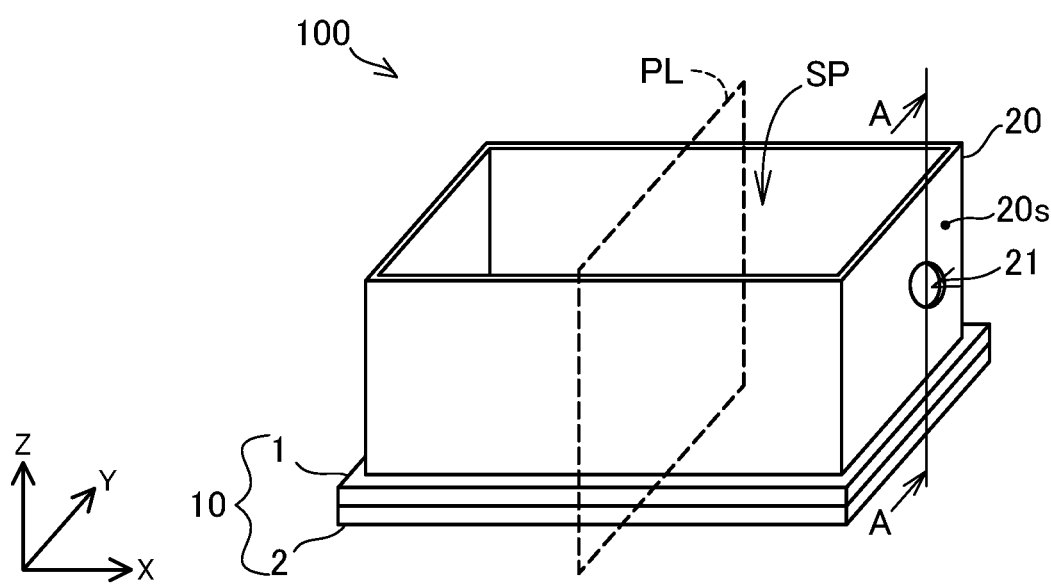
FIG. 1 is a schematic perspective view of a wiring substrate of an embodiment of the present invention.

FIG. 1 is a schematic perspective view of a wiring substrate 100 of an embodiment of the present invention.

The wiring substrate 100 of the present embodiment functions as an electronic component as a result of a semiconductor device being mounted on a base substrate 10. In the present embodiment, a recess 21 is formed on one of outer surfaces of a metallic surrounding member (metallic member) 20 disposed on the base substrate 10, and the recess 21 functions as a mark, thereby enabling recognition of the orientation of the wiring substrate 100.

As shown in FIG. 1, the wiring substrate 100 of the present embodiment includes the base substrate 10 having the shape of a rectangular plate, and the metallic surrounding member 20 disposed on the base substrate 10. The base substrate 10 includes a ceramic substrate 1 formed of, for example, aluminum nitride (AlN), and a heat sink 2 formed of a metal and disposed underneath the ceramic substrate 1. In FIG. 1, there is shown a Cartesian coordinate system CS defined by an X-axis, a Y-axis, and a Z-axis, which are orthogonal to each other. The X-axis and the Y-axis are defined to be parallel to the longer and shorter sides, respectively, of the rectangular base substrate 10. The Cartesian coordinate system CS corresponds to the Cartesian coordinate systems CS shown in FIGS. 2, 3, and 5.

The metallic surrounding member 20 used in the present embodiment is formed of copper (Cu) and its surface is plated with nickel (Ni) and gold (Au). The metallic surrounding member 20 is disposed on the base substrate 10 composed of the ceramic substrate 1 and the heat sink 2 stacked together; specifically, on the ceramic substrate 1. The metallic surrounding member 20 has the shape of a rectangular parallelepiped, has a rectangular cross-sectional shape, and has a central through hole extending in the Z-axis direction. In other words, the metallic surrounding member 20 is formed by combining two plates which are parallel to a ZX plane and two plates which are parallel to a YZ plane, whereby a space SP severing as a cavity is defined at the center. The edge of the metallic surrounding member 20 on the Z-axis negative direction side is brazed to the face of the ceramic substrate 1 of the base substrate 10, the face being located on the Z-axis positive direction side.

The metallic surrounding member 20 has an outer surface 20s which is located on the X-axis positive direction side and is parallel to the YZ plane. A recess 21 is formed on the outer surface 20s. The recess 21 is concave toward the X-axis negative direction side. The recess 21 has a circular shape in the YZ plane of the outer surface 20s. The recess 21 is formed on the outer surface 20s by means of cutting (dent forming process). A plane PL shown by a broken line in FIG. 1 is a plane which is parallel to the YZ plane and extends through the centroid of the metallic surrounding member 20 in a state in which the recess 21 is not formed. The metallic surrounding member 20 in which the recess 21 is not formed has a shape which is plane symmetric with respect to the plane PL serving as a reference. The recess 21 may be formed by means of press working when the metallic surrounding member 20 is formed.

Figure 2:
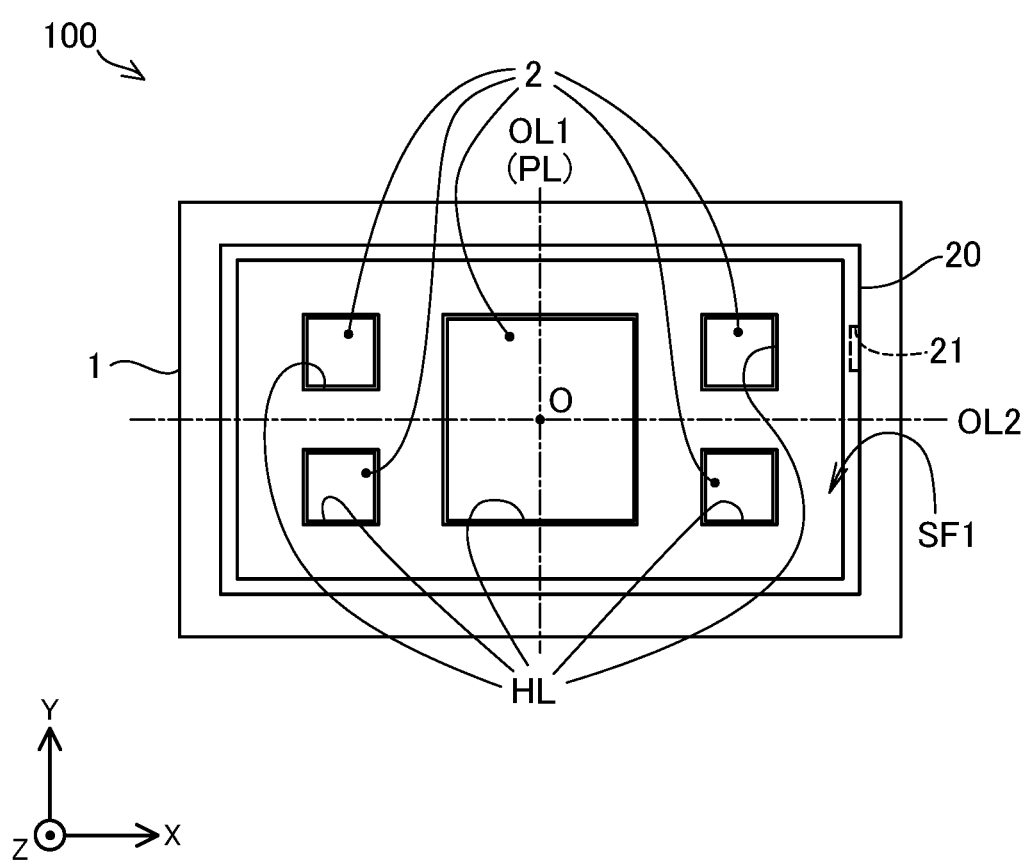
FIG. 2 is a schematic top view of the wiring substrate of the embodiment of the present invention.

FIG. 2 is a schematic top view of the wiring substrate 100. FIG. 2 schematically shows a first face SF1 (face on the Z-axis positive direction side) of the base substrate 10 within the space SP defined by the metallic surrounding member 20. A semiconductor device is disposed on the first face SF1, whereby the wiring substrate 100 functions as an electronic component.

As shown in FIG. 2, the ceramic substrate 1 has five rectangular through holes HL which extend in the thickness direction (the Z-axis direction). The heat sink 2 has five rectangular protrusions at positions corresponding to the five through holes HL. The protrusions protrude toward the Z-axis positive direction side. In the base substrate 10, the protrusion amounts of the protrusions of the heat sink 2 are determined such that the ends of the protrusions of the heat sink 2 on the Z-axis positive direction side become flush with the face of the ceramic substrate 1 on the Z-axis positive direction side.

In the present embodiment, the center of the metallic surrounding member 20 and the center of the base substrate 10 are located at a center O. Notably, the center O is the point of intersection between the first face SF1 and an imaginary line which extends in the Z-axis direction through the centroid of the metallic surrounding member 20 and the centroid of the base substrate 10. As shown in FIG. 2, the first face SF1 has a rectangular shape. Each of the base substrate 10 and the metallic surrounding member 20 in which the recess 21 is not formed has a plane-symmetric shape with respect to the plane PL (reference) which extends through the center O, is perpendicular to the first face SF1, and contains a center axis OL1 parallel to the Y-axis. Therefore, in other words, the recess 21 is formed on one of two outer surfaces which are located on opposite sides of the center axis OL1, which serves as a reference for plane symmetry; specifically, on the outer surface 20s located on the X-axis positive direction side. As shown in FIG. 2, the recess 21 is formed on the outer surface 20s to be located on the Y-axis positive direction side of the center axis OL2. Notably, the base substrate 10 and the metallic surrounding member 20 in which the recess 21 is not formed have respective shapes, each of which is plane symmetric with respect to a plane which extends through the center O, is perpendicular to the first face SF1, and contains the center axis OL2 parallel to the X-axis.

Figure 3:
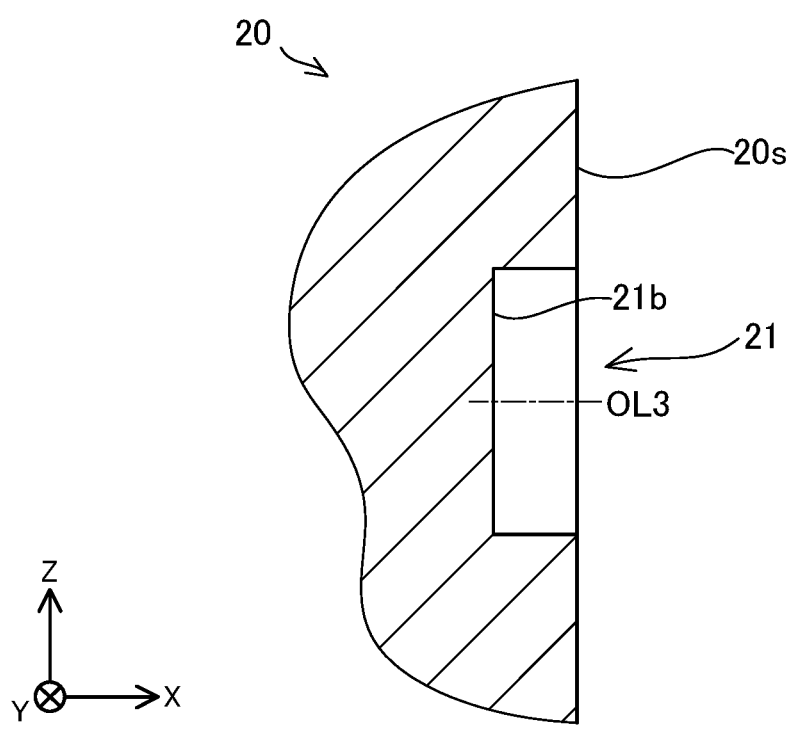
FIG. 3 is an explanatory view showing a recess.

FIG. 3 is an explanatory view showing the recess 21. FIG. 3 shows an enlarged schematic cross sectional view taken along line A-A in FIG. 1. As shown in FIG. 3, the recess 21 has a concave shape and extends from the outer surface 20s along a center axis OL3 parallel to the X-axis. The bottom surface 21b of the recess 21 located on the X-axis negative direction side is formed by a dent forming process. In the present embodiment, the bottom surface 21b is machined such that the surface roughness of the bottom surface 21b becomes smaller than the surface roughness of the outer surface 20s.

Figure 4:
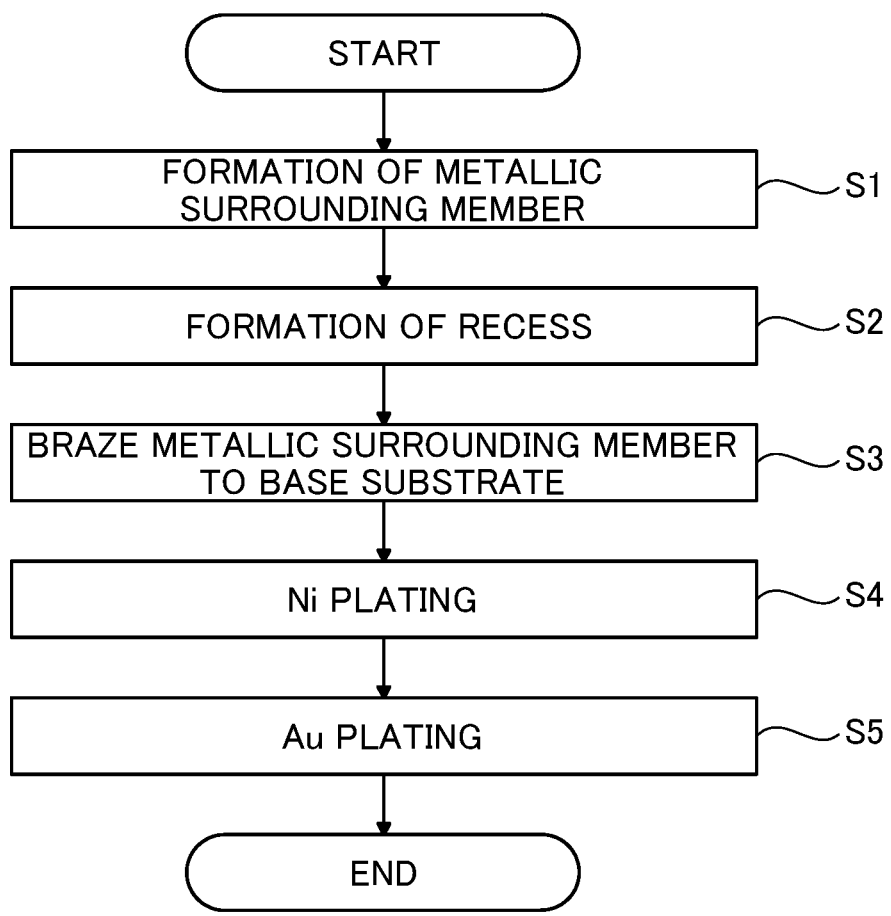
FIG. 4 is a flowchart showing a method for manufacturing the wiring substrate of the present embodiment.

FIG. 4 is a flowchart showing a method for manufacturing the wiring substrate 100 of the present embodiment. In the method for manufacturing the wiring substrate 100 shown in FIG. 4, first, the metallic surrounding member 20 is formed into a predetermined shape (step S1). The recess 21 is formed at a predetermined location on the formed metallic surrounding member 20 by a dent forming process. The metallic surrounding member 20 is brazed to the base substrate 10 formed by joining the ceramic substrate 1 and the heat sink 2 together beforehand (step S3). The metallic surrounding member 20 is plated with Ni so that a Ni plating layer is formed (step S4). The surface of the Ni plating layer of the metallic surrounding member 20 is plated with gold (Au) (step S5), whereby the manufacture of wiring substate 100 is completed. In step S4 and step S5, simultaneously with the plating of the metallic surrounding member 20, terminals of the base substrate 10 and the heat sink may be plated with appropriate metals. A step for mounting a semiconductor device, etc. on the manufactured wiring substrate 100 is performed. An electronic component containing the mounted semiconductor device is used as a final product.

Figure 5:
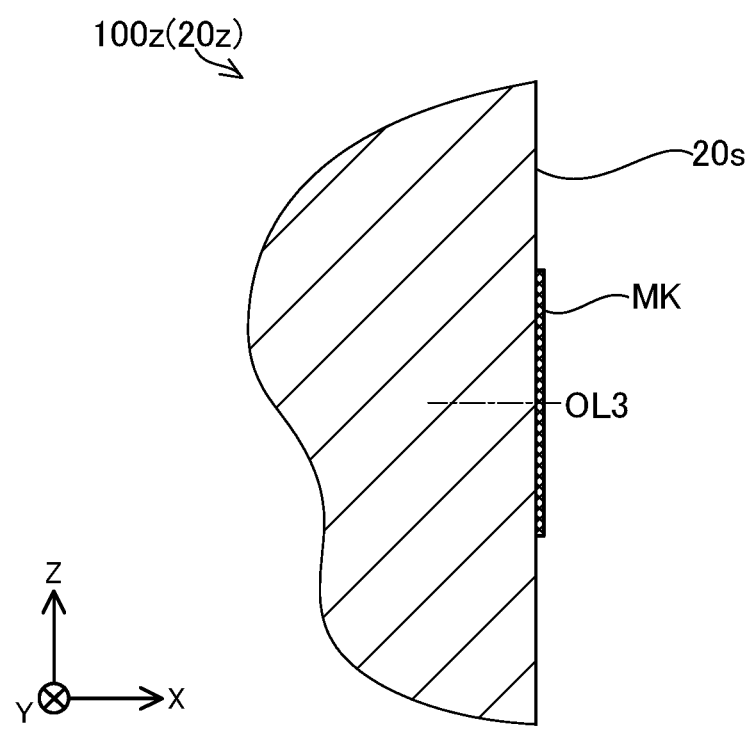
FIG. 5 is an explanatory view showing a wiring substrate of a comparative example.

FIG. 5 is an explanatory view showing a wiring substrate 100z of a comparative example. In the wiring substrate 100z of the comparative example, instead of the recess 21 employed in the wiring substrate 100 of the above-described embodiment, a circular ink mark MK is formed by applying ink to the outer surface 20s at the position where the recess 21 is formed. FIG. 5 shows a portion of the wiring substrate 100z of the comparative example, which portion corresponds to the portion of the wiring substrate 100 shown in FIG. 3. The method for manufacturing the wiring substrate 100z of the comparative example is identical to the method for manufacturing the wiring substrate 100 shown in FIG. 4 except that the method for manufacturing the wiring substrate 100z does not include the step of forming the recess 21 (step S2). Instead of the step S2, the method for manufacturing the wiring substrate 100z includes a step of applying ink for formation of the ink mark MK after the Au plating step (step S5).

As described above, in the wiring substrate 100 of the present embodiment, the metallic surrounding member 20 is brazed to the first face SF1 of the base substrate 10. As shown in FIG. 2, the metallic surrounding member 20 has a shape which is plane symmetric with respect to the plane PL (reference plane) which extends through the center O, is perpendicular to the first face SF1, and contains the center axis OL1 parallel to the Y-axis. The recess 21 (partial dent) is formed on the outer surface 20s of the metallic surrounding member 20. Therefore, in the present embodiment, since the recess 21 (partial dent) is formed on the outer surface 20s of the metallic surrounding member 20, despite the plane-symmetric shape of the metallic surrounding member 20, the orientation of the wiring substrate 100 can be easily recognized by using the recess 21 as a mark. In the present embodiment, unlike the comparative example in which a mark is formed on the outer surface 20s of the metallic surrounding member 20 by applying ink thereto, the recess 21 functioning as a mark is formed by changing the profile of the outer surface 20s of the metallic surrounding member 20. Therefore, unlike the comparative example in which a mark is formed by using ink, even in the case where an electronic component (the wiring substrate 100 with a semiconductor device mounted thereon) is exposed to a high-temperature environment, the recess 21 does not change and can be correctly recognized as a mark. Also, since the recess 21 does not gasify unlike ink, it is possible to prevent occurrence of an electrical failure or deterioration of sealing performance, which would otherwise occur due to corrosion of wiring of the base substrate 10 by gas. Namely, the wiring substrate 100 of the present embodiment can prevent occurrence of a failure of the electronic component. Furthermore, since the recess 21 is formed before the metallic surrounding member 20 is disposed on the base substrate 10, a step of applying ink after completion of the wiring substrate 100 becomes unnecessary, and it is possible to eliminate the risk of being scratched or dirtied when ink is applied.

Also, in the wiring substrate 100 of the present embodiment, as shown in FIG. 2, the first face SF1 has a rectangular shape. The recess 21 is formed on one of two outer surfaces located on opposite sides of the plane PL, which contains the center axis OL1 and serves as a reference for plane symmetry; specifically, the outer surface 20s located on the X-axis positive direction side. In the present embodiment, each of the base substrate 10 and the metallic surrounding member 20 has a plane-symmetric shape, thereby making it difficult to recognize their orientations. However, since the recess 21 functions as a mark, the orientation of the wiring substrate 100 as a whole can be recognized.

Also, in the present embodiment, since the recess 21 is formed by a dent forming process, the surface roughness of the bottom surface 21b is smaller than the surface roughness of the outer surface 20s. Therefore, in the wiring substrate 100 of the present embodiment, since the reflectance of the bottom surface 21b and the reflectance of the outer surface 20s differ from each other, when light impinges on the outer surface 20s, the bottom surface 21b of the recess 21 reflects the light differently from the outer surface 20s. Therefore, the position of the recess 21 can be easily detected. For example, in the case where the recess 21 is recognized by image processing, the recess 21 on the outer surface 20s is clearly distinguished from the remaining portion of the outer surface 20s by means of binarization. Also, in the case where the outer surface 20s is viewed while the wiring substrate 100 is rotated by a predetermined angle (for example, 30 degrees) around the Y-axis, the recess 21 can be easily distinguished on the basis of the difference in reflectance.

Modifications of the Present Embodiment

The present invention is not limited to the above-described embodiment and can be implemented in various forms without departing from the gist of the present invention. For example, the following modifications are possible.

The wiring substrate 100 of the above-described embodiment is one example, and the structure, etc. of the wiring substrate 100 may be modified, so long as the recess 21 is formed on the outer surface 20s of the metallic surrounding member 20. For example, the base substrate 10 may be composed of the ceramic substrate 1 only or may include other components in addition to the ceramic substrate 1 and the heat sink 2. The base substrate 10 of the above-described embodiment is a substrate formed by stacking the single ceramic substrate 1 and the single heat sink 2. However, a plurality of ceramic substrates 1 may be stacked. The material of the ceramic substrate 1 may be other than AlN, and, for example, oxide ceramics such as alumina, silica, titania, and zirconia and nitride ceramics such as silicon nitride and titanium nitride can be used. The material of the heat sink 2 and the metallic surrounding member 20 may be other than Cu, and their material may be gold (Au), silver (Ag), platinum (Pt), or an alloy of these metals.

The position of the recess 21 in the above-described embodiment is one example, and the recess 21 may be formed at any position, so long as the position is located within the region of the outer surfaces, including the outer surface 20s on the X-axis positive direction side. For example, the recess 21 may be formed on the outer surface of the metallic surrounding member 20 which is located on the Y-axis negative direction side and is parallel to the ZX plane. The recess 21 may be formed at a position where the outer surface intersects the plane PL parallel to the YX plane containing the center axis OL1 shown in FIG. 2, or a position where the outer surface intersects the ZX plane extending through the center axis OL2. The recess 21 is preferably formed in a central 90% region of the outer surface in the height direction (the Z-axis direction) excluding a 5% region on the upper side and a 5% region on the lower side; i.e., on the side toward the base substrate 10. The recess 21 may have a shape other than a circular shape and its shape may be changed so long as the recess 21 functions as a mark for orientation recognition. The depth of the recess 21 from the outer surface 20s may be changed. Furthermore, the surface roughness of the bottom surface 21b may be greater than the surface roughness of the outer surface 20s.

In the above-described method for manufacturing the wiring substrate 100 shown in FIG. 4, the steps S1 and S2 are performed separately. However, the steps S1 and S2 may be performed simultaneously by using press working. Also, the manufacturing method may be modified in such a manner that, after formation of the recess 21 in the step S2, the metallic surrounding member 20 is solely plated with Ni, the step S3 is then performed, and, additionally, the metallic surrounding member 20 is again plated with Ni.

Although the present invention has been described on the basis of its embodiment and modifications, the above-described embodiment is provided so as to facilitate the understanding of the present invention and does not limit the present invention. The present invention can be changed or improved without departing from the purpose and the scope of the claims, and encompasses equivalents thereof. Also, the technical feature(s) may be eliminated unless the present specification mentions that the technical feature(s) is essential.

What is claimed is:

1. A wiring substrate comprising:

a base substrate; and a metallic member disposed on a first face of the base substrate, the metallic member including outer surfaces, wherein the metallic member has a shape which is plane symmetric with respect to a plane which extends through a center of the first face and is perpendicular to the first face;

a recess is formed, as a partial dent, on one of the outer surfaces of the metallic member, the recess includes a bottom surface having a bottom surface roughness, the one of the outer surfaces of the metallic member has an outer surface roughness, and the bottom surface roughness is smaller than the outer surface roughness.

2. The wiring substrate according to claim 1, wherein the first face is rectangular;

the plane is parallel to one side of the first face;

the base substrate and the metallic member have shapes which are plane symmetric with respect to the plane; and the recess is formed on one of two outer surfaces of the metallic member which are located on opposite sides of the plane.

\* \* \* \* \*